US008950032B2

(12) United States Patent
Cheng et al.

(10) Patent No.: US 8,950,032 B2
(45) Date of Patent: Feb. 10, 2015

(54) CLEANING CYLINDER APPARATUS

(75) Inventors: Tung-Chung Cheng, Hsinchu County (TW); Chih-An Ku, Hsinchu (TW); Hung-Chia Chen, Hsinchu County (TW); Jung-Pin Mao, Hsinchu (TW)

(73) Assignee: Tung An Development Ltd., Jhubei, Hsinchu County (TW)

( * ) Notice: Subject to any disclaimer, the term of this patent is extended or adjusted under 35 U.S.C. 154(b) by 448 days.

(21) Appl. No.: 13/192,422

(22) Filed: Jul. 27, 2011

(65) Prior Publication Data

US 2012/0096660 A1    Apr. 26, 2012

(30) Foreign Application Priority Data

Oct. 21, 2010    (TW) .............................. 099220341 U

(51) Int. Cl.
| A47L 11/164 | (2006.01) |
| B08B 1/04 | (2006.01) |
| H01L 21/67 | (2006.01) |
| A46B 13/00 | (2006.01) |

(52) U.S. Cl.
CPC ............ *B08B 1/04* (2013.01); *H01L 21/67046* (2013.01); *A46B 13/001* (2013.01)
USPC .......................................................... 15/230

(58) Field of Classification Search
CPC .............. A47L 11/4038; A47L 11/164; A47L 11/4036; B24D 13/20; B24D 9/08; B24D 13/147
USPC ........................ 15/230, 118, 179, 181, 209.1
See application file for complete search history.

(56) References Cited

U.S. PATENT DOCUMENTS

| 2,978,726 | A | * | 4/1961 | Park ................................ 15/183 |
| 3,755,847 | A | * | 9/1973 | Liebscher ........................ 15/179 |
| 5,083,840 | A | * | 1/1992 | Young et al. .................... 300/21 |
| 2005/0241092 | A1 | * | 11/2005 | Takesawa et al. ............... 15/179 |
| 2007/0209135 | A1 | * | 9/2007 | Chen et al. ...................... 15/230 |

* cited by examiner

*Primary Examiner* — Robert Scruggs
(74) *Attorney, Agent, or Firm* — Jackson IPG PLLC

(57) ABSTRACT

A novel cleaning tool is provided. A net-like carrier is twined on an inner cylinder. Protrusions of the inner cylinder are butted again a cleaning unit. With the net-like carrier and the protrusions, a bond between the cleaning unit and the inner cylinder is enhanced to strengthen the whole structure. Thus, stability of high-speed rotation of the cleaning unit is further improved to avoid separating the cleaning unit and the inner cylinder.

1 Claim, 3 Drawing Sheets

CLEANING CYLINDER APPARATUS

TECHNICAL FIELD OF THE DISCLOSURE

The present disclosure relates to a cleaning tool; more particularly, relates to twining a net-like carrier on an inner cylinder to be strengthened by protrusions for enhancing a bond between a cleaning unit and the inner cylinder; and, thus, improving stability of high-speed rotation of the cleaning unit to avoid separating the cleaning unit and the inner cylinder.

DESCRIPTION OF THE RELATED ART

A general cleaning tool for precision devices like silicon wafers, hard drive disks, semiconductors, CPU chips, etc. comprises a rotating cylinder and a cleaning sponge on an outer surface of the rotating cylinder. The cleaning sponge is usually a porous elastic sponge made of polyvinyl acetaldehyde and has protrusions at a side surface. Coordinated with a motor, the rotating cylinder is rotated to further carry the cleaning sponge for cleaning a precision device by contacting surface of the precision device with tops of the protrusions.

Although the prior art can be used to clean precision devices, the bond between the rotating cylinder and the cleaning sponge is not strong. As a result, when the prior art is carried to be rotated by the motor, the cleaning sponge may be easily broken away and stability may become worse. Although an adhesion material can be applied between the rotating cylinder and the cleaning sponge, the cleaning sponge will become not easy to be replaced. Not to mention that the cleaning sponge may become hardened and deteriorated owing to the adhesion material applied, and the precision devices cleaned with the prior art may be thus harmed by scraping. Hence, the prior art does not fulfill all users' requests on actual use.

SUMMARY OF THE DISCLOSURE

The main purpose of the present disclosure is to twine a net-like carrier on an inner cylinder to be strengthened by protrusions for enhancing a bond between a cleaning unit and the inner cylinder; and, thus, to strengthen stability of high-speed rotation of the cleaning unit to avoid separating the cleaning unit and the inner cylinder.

To achieve the above purpose, the present disclosure is a cleaning cylinder apparatus, comprising an inner cylinder, a net-like carrier and a cleaning unit, where the inner cylinder has a plurality of protrusions on an outer surface of the inner cylinder; the net-like carrier is covered around on the outer surface of the inner cylinder; the net-like carrier is bond to the protrusions on the outer surface of the inner cylinder; the cleaning unit is an outer cylinder around on the outer surface of the inner cylinder; and the cleaning unit is adhered around on the inner cylinder by closely binding the protrusions and the net-like carrier. Accordingly, a novel cleaning cylinder apparatus is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the perspective view showing the preferred embodiment according to the present disclosure;

DESCRIPTION OF THE PREFERRED EMBODIMENT

The following description of the preferred embodiment is provided to understand the features and the structures of the present disclosure.

Figure 1:
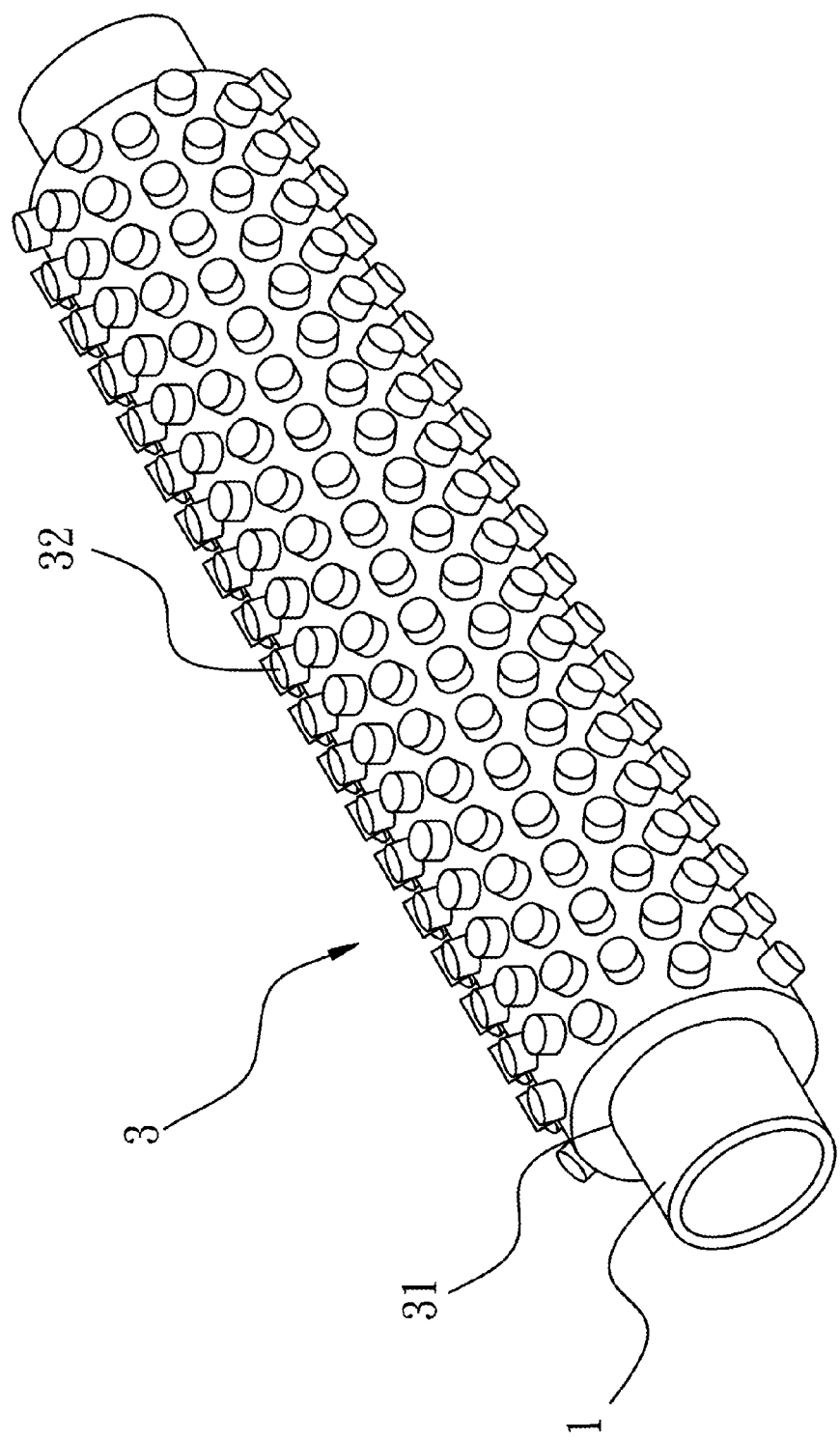
Figure 2:
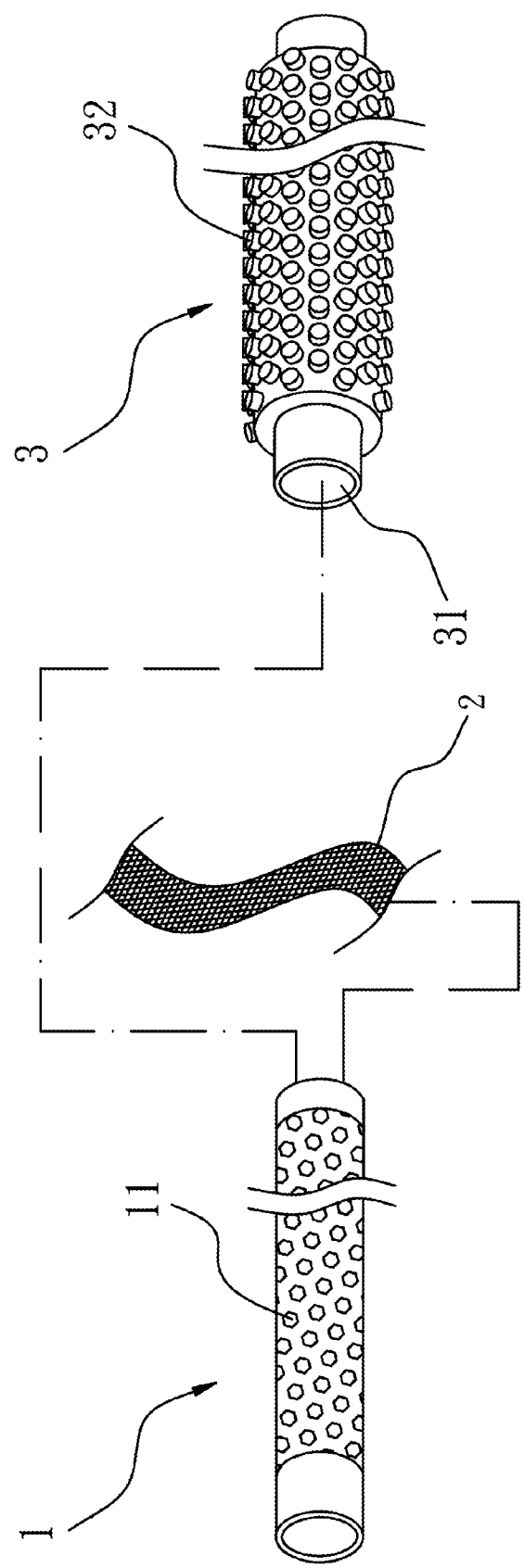
FIG. 2 is the exploded view showing the preferred embodiment.
Figure 3:
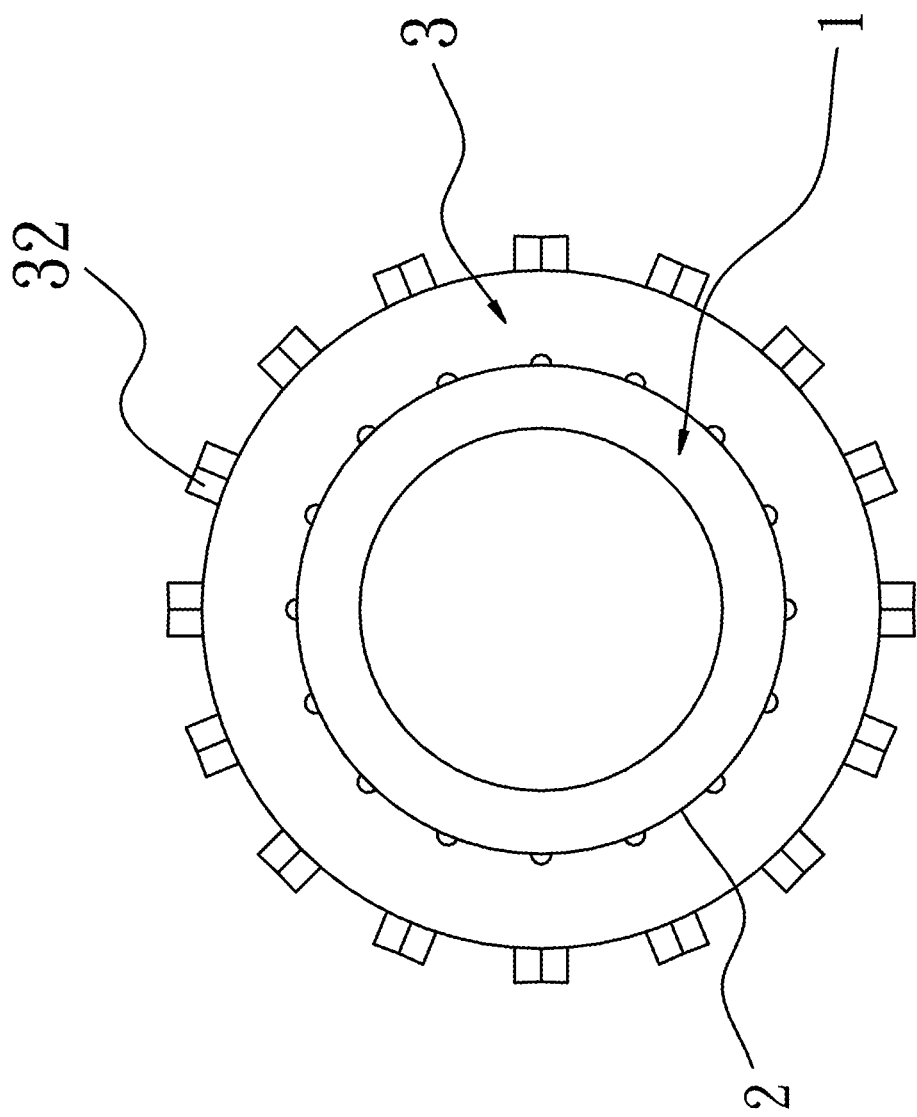
FIG. 3 is the sectional view showing the preferred embodiment.

Please refer to FIG. 1 to FIG. 3, which are a perspective view, an exploded view and a sectional view showing a preferred embodiment according to the present disclosure. As shown in the figures, the present disclosure is a cleaning cylinder apparatus, comprising an inner cylinder 1, a net-like carrier 2 and a cleaning unit 3.

The inner cylinder 1 has a plurality of protrusions 11 on an outer surface of the inner cylinder 1. Each top surface of the protrusions 11 is a cambered surface or is shrunk. All area or a part of the outer surface of the inner cylinder 1 is set with the protrusions 11 and every two protrusions 11 have a certain distance in between.

The net-like carrier 2 is covered around on the outer surface of the inner cylinder 1 and is bond with the protrusions 11. The net-like carrier 2 is made of a flexible material and is twined on the outer surface of the inner cylinder 1.

The cleaning unit 3 has a hollow 31 at center inside the cleaning unit 3 to set the cleaning unit 3 around on the outer surface of the inner cylinder 1. The cleaning unit 3 is adhered around on the inner cylinder 1 by closely binding the protrusions 11 and the net-like carrier 2. The cleaning unit 3 is made of a sponge material and the cleaning unit 3 has a plurality of cleaning parts 32 on an outer surface of the cleaning unit 3. Thus, a novel cleaning cylinder apparatus is obtained.

On using the present disclosure, the net-like carrier 2 is twined on the outer surface of the inner cylinder 1 to closely bind the net-like carrier 2 and the protrusions 11 on the outer surface of the inner cylinder 1. Thus, by using the protrusions 11 and the net-like carrier 2 twined on the outer surface of the inner cylinder 1, strength of the present disclosure is improved. The inner cylinder 1 is set in the hollow 31 of the cleaning unit 3 so that the cleaning unit 3 is covered around on the outer surface of the inner cylinder 1. Therein, the protrusions 11 are butted on an inner surface of the hollow 31 to be contacted with the net-like carrier 2; and the bond between the cleaning unit 3 and the inner cylinder 1 is thus further enhanced. When the inner cylinder 1 is set to work with a rotator (not shown in the figures) for cleaning a precision electric device with the cleaning parts 32 of the cleaning unit 3, the stability of high-speed rotation of the cleaning unit 3 is improved by the protrusions 11 and the net-like carrier 2 to avoid separating the cleaning unit 3 and the inner cylinder 1.

To sum up, the present disclosure is a cleaning cylinder apparatus, where a net-like carrier is twined on an inner cylinder to be strengthened by protrusions for enhancing a bond between a cleaning unit and the inner cylinder; and, thus, stability of high-speed rotation of the cleaning unit is improved to avoid separating the cleaning unit and the inner cylinder.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A cleaning cylinder apparatus, comprising:

an inner cylinder of a first overall length, said inner cylinder having a plurality of protrusions only on at least a part of an outer surface of a medially arranged shorter second length portion of said inner cylinder such that the protrusions are located only within the medially arranged portion of the outer surface of the inner cylinder of the second shorter length and not extending to either end of the inner cylinder, wherein each to surface of each protrusion is a cambered surface or is shrunk;

a net-like carrier made of flexible material and of substantially the shorter second length, said net-like carrier being covered around only on said medially arranged shorter second length portion of the outer surface of said inner cylinder, said net-like carrier being twined to said protrusions on said outer surface of said inner cylinder; and a cleaning unit made of sponge material and with a central hollow and a plurality of cleaning parts arranged on an outer surface of the cleaning unit and wherein the cleaning unit is of substantially the shorter second length, said cleaning unit being an outer cylinder around only on said medially arranged shorter second length portion of the outer surface of said inner cylinder, said cleaning unit being adhered around on said inner cylinder by closely binding said protrusions and said net-like carrier.

\* \* \* \* \*